(12) United States Patent
Lee

(10) Patent No.: US 7,057,943 B2
(45) Date of Patent: Jun. 6, 2006

(54) DATA OUTPUT CONTROLLER FOR MEMORY DEVICE

(75) Inventor: Kang Youl Lee, Chugcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/023,654

(22) Filed: Dec. 28, 2004

(65) Prior Publication Data

US 2006/0077725 A1    Apr. 13, 2006

(30) Foreign Application Priority Data

Oct. 12, 2004    (KR) ...................... 10-2004-0081375

(51) Int. Cl.
G11C 7/10 (2006.01)
G11C 8/00 (2006.01)
G11C 11/34 (2006.01)

(52) U.S. Cl. ............. 365/189.05; 365/233; 365/185.09

(58) Field of Classification Search .......... 365/189.05, 365/233, 185.19

See application file for complete search history.

(56) References Cited

U.S. PATENT DOCUMENTS

| 5,535,171 | A  | * | 7/1996 | Kim et al. ................... 365/233 |
| 5,903,514 | A  | * | 5/1999 | Sawada ...................... 365/233 |
| 6,212,126 | B1 | * | 4/2001 | Sakamoto ................... 365/233 |
| 6,249,483 | B1 | * | 6/2001 | Kim ............................ 365/233 |
| 6,317,369 | B1 | * | 11/2001 | Kubo et al. ................. 365/193 |

* cited by examiner

*Primary Examiner*—Amir Zarabian
*Assistant Examiner*—Anthan Tran

(74) *Attorney, Agent, or Firm*—Ladas & Parry LLP

(57) ABSTRACT

Disclosed is a data output controller for a memory device. The data output controller for a memory device, the data output controller comprising a control part for generating a first pulse control signal and a second pulse control signal through a combination of an internal clock signal outputted from a DLL means and a pulse signal enabled during a time in which a number of clocks of the internal clock signal, corresponding to a burst length of the memory device, is counted, a data output buffer unit controlled by the first plus control signal, and a data strobe signal buffer unit controlled by the second pulse control signal.

9 Claims, 4 Drawing Sheets

DATA OUTPUT CONTROLLER FOR MEMORY DEVICE

BACKGROUND OF THE INVENTION

1. Field of the Invention

The present invention relates to a data output controller for a memory device, and more particularly to a data output controller allowing data eyes to have the same width by adjusting a timing in which data are outputted from a synchronous memory device such as DDR SDRAM and DDR2 SDRAM.

2. Description of the Prior Art

FIG. 1 is a circuit view showing a typical data output controller used for a synchronous memory device.

For the purpose of description, description about functions of signals shown in FIG. 1 will be given before that of a data output controller operation.

RKDLL denotes an output signal of a Delay Locked Loop circuit used for a synchronous memory device such as DDR SDRAM and DDR2 SDRAM and has a negative delay with respect to an external clock signal (a signal CLK shown in FIG. 2). Data outputted from a memory device can be arranged in synchronization with the external clock signal by using the signal RCKDLL having a negative delay with respect to the external clock signal CLK. In more detail, the signal RCKDLL being an output clock of the DLL circuit has a negative delay with respect to the external clock signal CLK being a reference clock, and sends data outputted from the interior of the memory device at a time point in which the external clock signal is inputted.

ROUTEN denotes a window signal for determining the number of pulses of the signal RCKDLL for data output.

ROUTNE2 denotes a signal obtained by delaying the signal ROUTEN by a predetermined time.

RCK_DO_QS denotes a DLL clock signal for outputting a signal DQS and is outputted correspondingly to a burst length.

DQS denotes signal defined in a standard for DDR SDRAM or DDR2 SDRAM. This signal latches data at a write operation and is toggled to a high level/a low level while being aligned with data at a read operation.

It can be understood from FIG. 1 that the signal RCK_DO_QS controls timing at which a data buffer 106 and a DQS buffer 107 operate. In FIG. 1, although the data buffer 106 and the DQS buffer 107 are realized by using a D-flip/flop, this is an example for the purpose of description. Accordingly, those skilled in the art can realize various circuits for outputting data and the signal DQS in synchronization with a rising edge and a falling edge of the signal RCK_DO_QS.

FIG. 2 is a signal timing chart for explaining an operation of the data output controller shown in FIG. 1. Hereinafter, description about a case in which "CL=6" and "BL=8" in a memory device will be given with reference to FIG. 2. For reference, in FIG. 2, 'N' of 'DQ<1:N>' indicates the number of input/output data pins, and each input/output pin sequentially outputs eight data. Herein, the CL denotes CAS latency.

A read command is applied in synchronization with a rising edge of a pulse marked as '0,0' of the external clock signal (CLK) in FIG. 2. Since 'CL' is equal to six, data are outputted in synchronization with a rising edge of a sixth pulse of the external clock signal CLK (the rising edge of a pulse marked as '6,0' of the external clock signal) after the read command is applied.

As described above, the internal clock signal RCKDLL is a signal outputted from the DLL circuit and has a negative delay with respect to the external clock signal CLK. FIG. 2 shows a negative delay in which the internal clock signal RCKDLL leads about one clock pulse over the external clock signal CLK.

As noted from FIG. 2, the signal RCK_DO_QS is a signal outputted through an AND operation of the signal ROUTEN2 and the signal RCKDLL during a high level of the signal ROUTEN2.

As noted from FIGS. 1 and 2, the signal DQS and the data signal DQ are outputted in synchronization with a rising edge and a falling edge of the signal RCK_DO_QS.

However, as noted from FIG. 2, the state of a first pulse of the signal DQS is changed to a logic high from a logic low, and the state of a first pulse of the data signal is changed into a logic high or a logic low from a high impedance state having ½VCC. For this reason, a duration for output of the first data is greater an interval of 't1' than each of durations for output of the remaining seven data which are outputted subsequently to the first data. Herein, the 't1' means a time in which the state of the output port of the data output buffer (reference numeral 106 shown in FIG. 1) is changed into a low impedance state from a high impedance state. In this case, the high impedance state refers to a state in which the data output buffer is not operated, and the low impedance state refers to a state in which the data output buffer is normally operated. Such a time 't1' is called "tLZ (Data Low Impedance time)". It is problematic that the conventional memory device has an unstable tLZ.

Data eyes of sequentially outputted data have different widths due to this timing difference, tLZ. In other words, as shown in FIG. 2, a data eye of the first data is different from data eyes of the second data to the eighth data.

Also, when a plurality of memory devices share a common data bus and data are subsequently outputted from at least two memory devices, an instantaneous short may occur between a voltage source and ground during the 't1'. In other words, if the last data of the first memory device has a high state and the first data of the second memory device has a low state, the interval 't1' may connect the logics of 'High' and 'Low' to each other, thereby causing short-circuiting. Such an instantaneous short may make a memory device or PCB board unstable and cause damage of a power circuit.

SUMMARY OF THE INVENTION

Accordingly, the present invention has been made to solve the above-mentioned problems occurring in the prior art, and an object of the present invention is to provide a data output controller enabling data outputted from a data buffer to have the same data window (data eye).

To accomplish the above object, there is provided a data output controller for a memory device, comprising a first switching part turned on/off by an internal clock signal outputted from a DLL means and receiving a first pulse signal enabled during a predetermined time in synchronization with the internal clock signal, a latch part for latching the first pulse signal passing through the first switching part, a second switching part turned on/off by the internal clock signal and receiving a latch part output signal outputted from the latch part, a first decoding part for receiving the latch part output signal and a second switching part output signal outputted from the second switching part and performing an 'AND' operation of the received latch part output signal and the received second switching part output signal, a second decoding part for receiving a first decoding part output signal and the internal clock signal and performing an 'AND' operation of the received first decoding part output signal and the internal clock signal, a third decoding part for receiving the latch part output signal and the internal clock signal and performing an 'AND' operation of the received latch part output signal and the internal clock signal, a data output buffer unit controlled by the second decoding part output signal, and a data strobe signal buffer unit controlled by a third decoding part output signal.

According to the present invention, the first pulse signal is enabled during a time in which the number of clocks of the internal clock signal, corresponding to a burst length of the memory device, is counted.

According to the present invention, windows of data sequentially outputted from the data output buffer unit have the same width.

According to the present invention, the first pulse signal is enabled during a time in which the number of clocks of the internal clock signal, corresponding to a burst length of the memory device, is counted, and the latch part output signal is obtained by delaying the first pulse signal by a predetermined time and is enabled during a toggling duration of the internal clock signal corresponding to CAS latency of the memory device.

According to another aspect of the present invention, there is provided a data output controller for a memory device, the data output controller comprising: a control part for generating a first pulse control signal and a second pulse control signal through a combination of an internal clock signal outputted from a DLL means and a pulse signal enabled during a time in which a number of clocks of the internal clock signal, corresponding to a burst length of the memory device, is counted, a data output buffer unit controlled by the first pulse control signal, and a data strobe signal buffer unit controlled by the second pulse control signal.

According to another aspect of the present invention, the first pulse control signal and the second pulse control signal are valid during the burst length, a first pulse rising edge occurring time point of the first pulse control signal is faster than a first pulse rising edge occurring time point of the second pulse control signal, and falling edges and rising edges of the first pulse control signal coincide with those of the second pulse control signal except for rising edges of first pulses of the first pulse control signal and the second pulse control signal.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
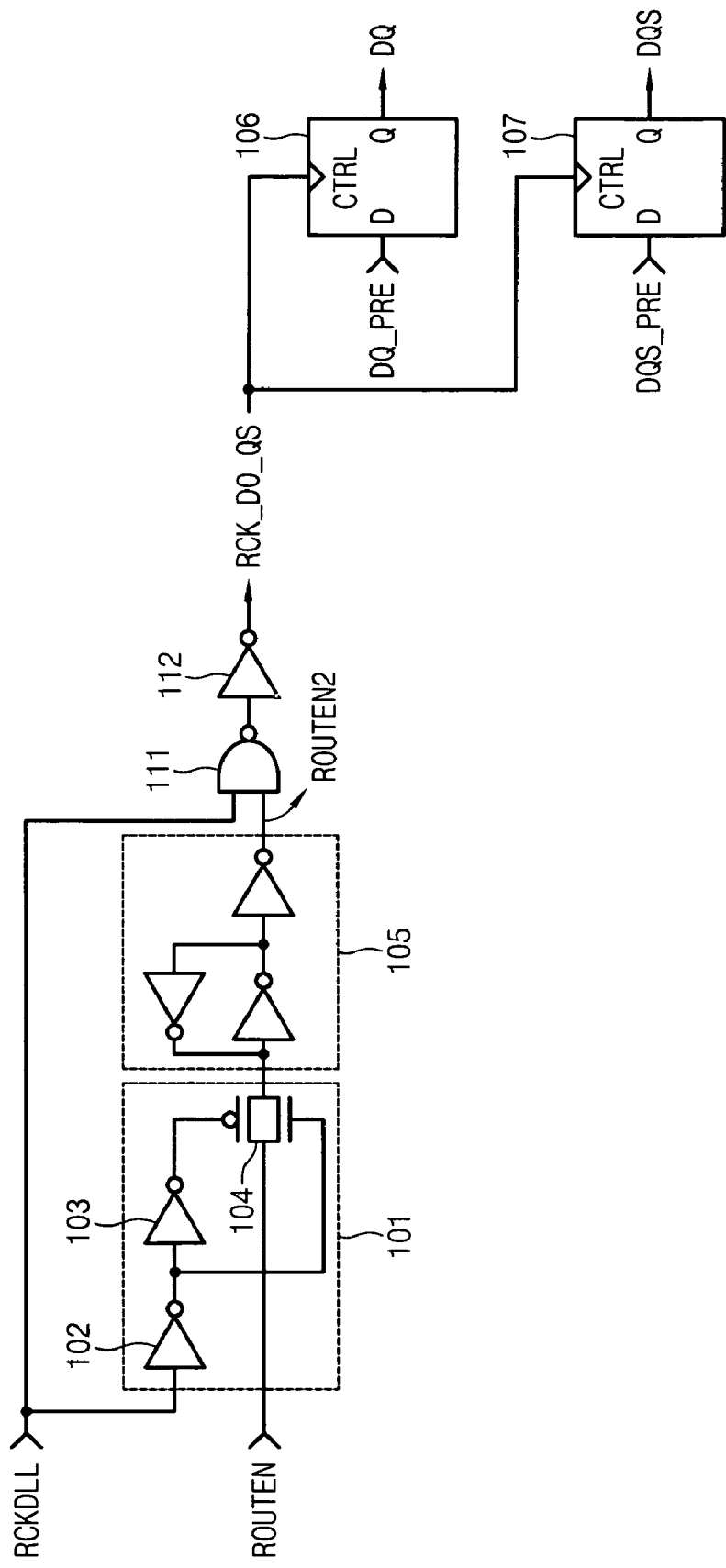
FIG. 1 is a circuit view showing a typical data output controller used for a synchronous memory device.
Figure 2:
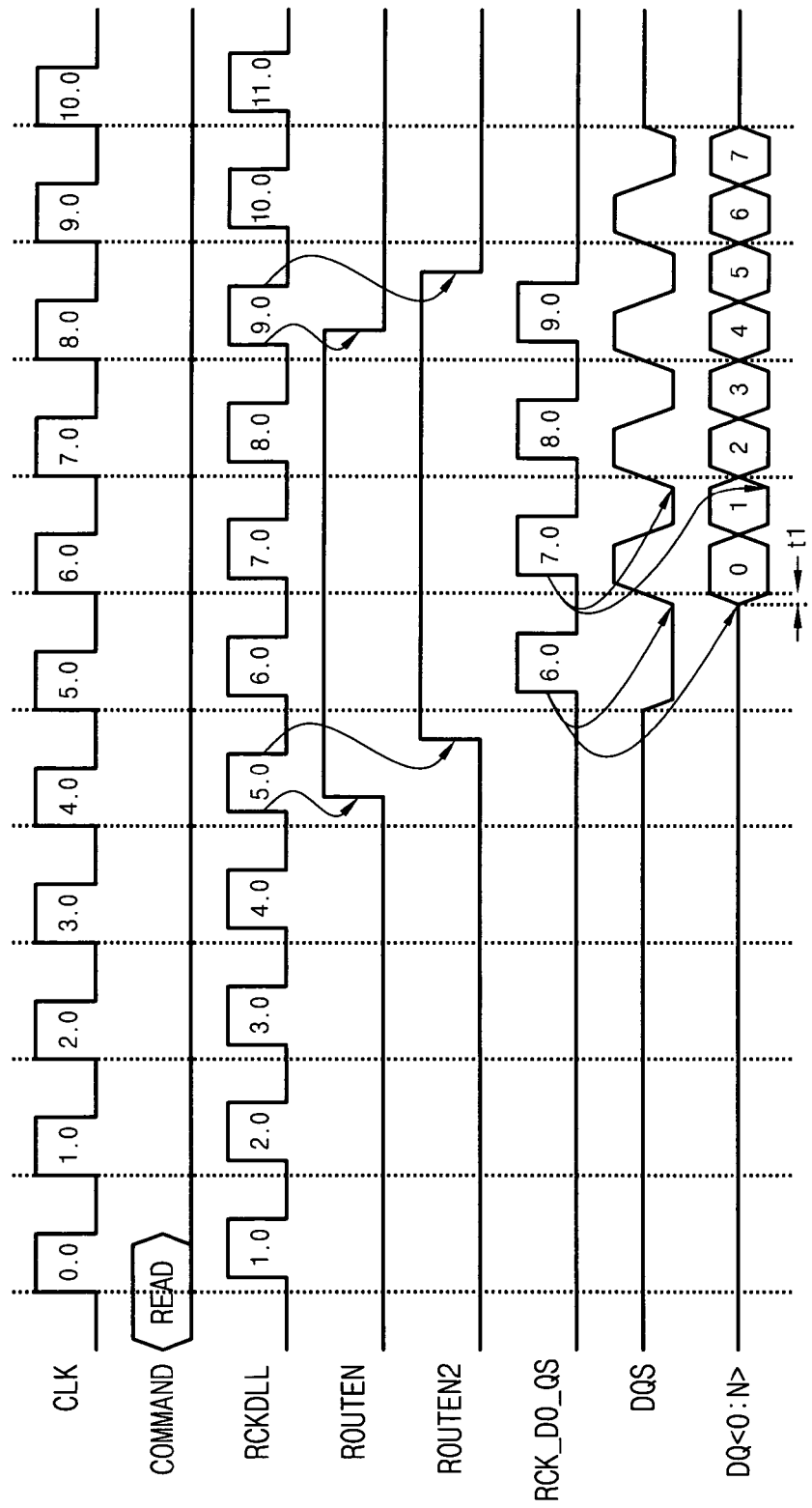
FIG. 2 is a signal timing chart for explaining an operation of the data output controller shown in FIG. 1.

Hereinafter, preferred embodiments of the present invention will be described with reference to the accompanying drawings. In the following description and drawings, the same reference numerals are used to designate the same or similar components, and so repetition of the description on the same or similar components will be omitted.

Figure 3:
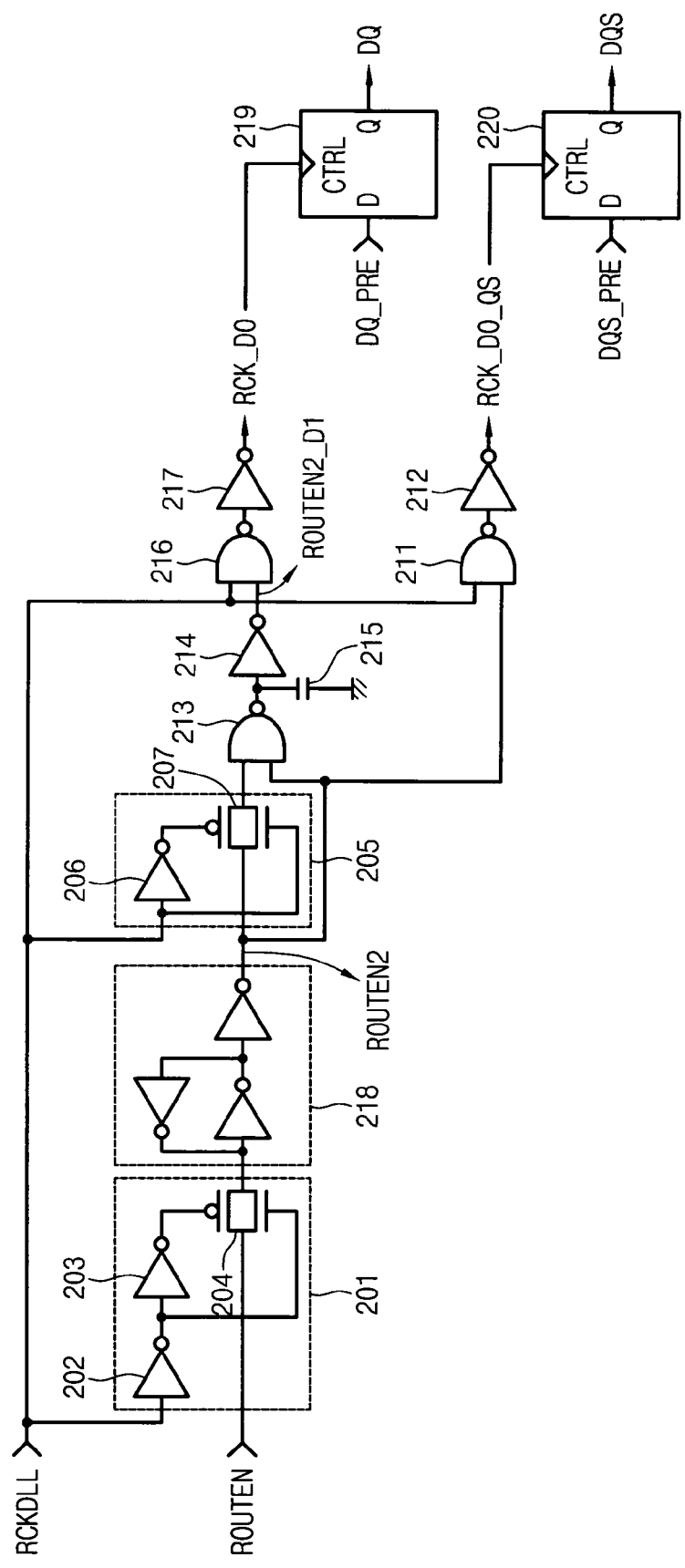
FIG. 3 is a circuit diagram showing a data output controller according to one embodiment of the present.
Figure 4:
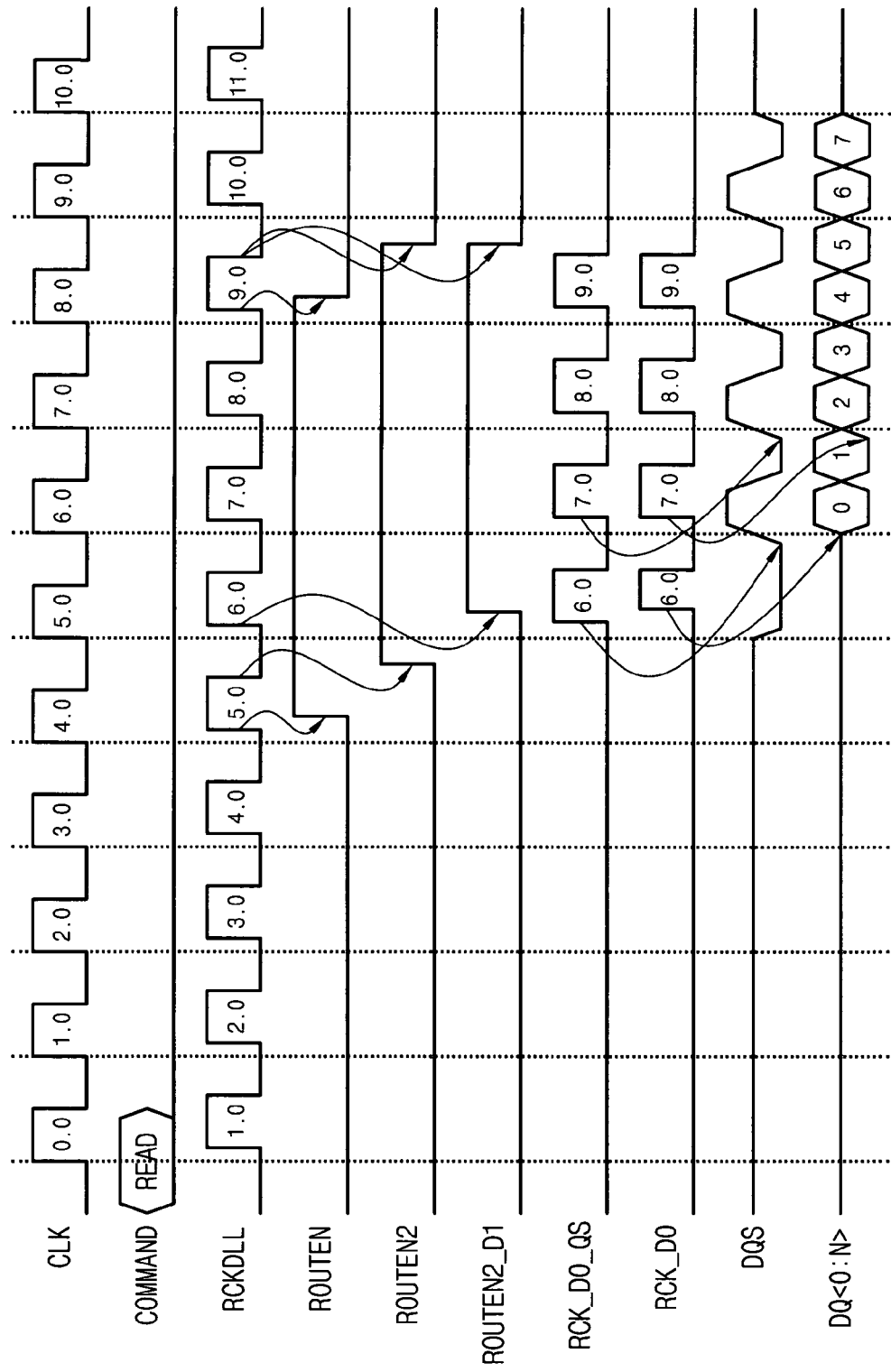
FIG. 4 is a signal timing chart for explaining an operation of the data output controller shown in FIG. 3.

FIG. 3 is a circuit diagram showing a data output controller according to one embodiment of the present. For reference, functions of signals shown in FIGS. 3 and 4 are identical to those of the conventional technique. Herein, a signal RCK_DO is similar to the signal RCK_DO_QS. However, differently from the convention technique, the signal RCK_DO is an additional signal for controlling only a data signal.

As shown in FIG. 3, the data output controller for a memory device includes a switching part 201 and 205, a latch part 218, a decoding part 213 and 214, a decoding part 216 and 217, and a decoding part 211 and 212.

The switching part 201 includes inverters 202 and 203 and a transmission gate 204. The inverter 202 receives an internal clock signal RCKDLL outputted from a DLL circuit (not shown), and the inverter 203 receives an output signal of the inverter 202. The transmission gate 204 is formed by coupling a PMOS transistor with an NMOS transistor in parallel. The output signal of the inverter 202 is applied to the NMOS transistor of the transmission gate 204, and the output signal of the inverter 203 is applied to the PMOS transistor of the transmission gate 204.

The transmission gate 204 receives a pulse signal ROUTEN enabled during a predetermined time in synchronization with the internal clock signal RCKDLL. The pulse signal ROUTEN is a window signal for determining the number of pulses of the internal clock signal RCKDLL for outputting data. A duration for which the pulse signal ROUTEN is enabled corresponds to the length of burst of the memory device.

An output of the switching part 201 is connected to the latch part 218. The latch part 218 receives and latches a signal passing through the switching part 201.

The switching part 205 includes an inverter 206 and a transmission gate 207. The inverter 206 receives the internal clock signal RCKDLL. The transmission gate 207 is formed by coupling a PMOS transistor with an NMOS transistor in parallel. An output signal of the inverter 206 is applied to the PMOS transistor gate of the transmission gate 207, and the internal clock signal RCKDLL is applied to the NMOS transistor gate of the transmission gate 207.

The transmission gate 207 receives the output signal ROUTEN2 of the latch part 218.

The decoding part 213 and 214 includes a NAND gate 213 and an inverter 214. The NAND gate 213 receives an output signal of the transmission gate 207 and the output signal ROUTEN 2 of the latch part 218. The inverter 214 receives an output signal of the NAND gate 213. A capacitor 215 positioned between grounding and an output port of the NAND gate 213 adjusts a delay time of a signal.

The decoding part 216 and 217 includes a NAND gate 216 and an inverter 217. The NAND gate 216 receives the internal clock signal RCKDLL and an output signal of the inverter 214, and the inverter 217 receives an output signal of the NAND gate 216.

The decoding part 211 and 212 includes a NAND gate 211 and an inverter 212. The NAND gate 211 receives the internal clock signal RCKDLL and the output signal ROUTEN2 of the latch part 218, and the inverter 212 receives an output signal of the NAND gate 211.

The output signal RCK_DO of the inverter 217 controls an operation of the data output buffer 219.

The output signal RCK_DO_QS of the inverter 212 controls an operation of a buffer 220 for a data strobe signal.

In FIG. 3, although the data buffer 219 and the buffer 220 for the data strobe signal 220 are realized by using D-flip/flops, this is an example for the purpose of description. Accordingly, those skilled in the art can realize various circuits having the same function as the D-flip/flops.

FIG. 4 is a signal timing chart for explaining an operation of the data output controller shown in FIG. 3. In particular, FIG. 4 illustrates a case in which "CL=6" and "BL=8" in a memory device. For reference, in FIG. 4, 'N' of 'DQ<1:N>' indicates the number of input/output data pins, and one input/output pin sequentially outputs eight data.

A read command is applied in synchronization with a rising edge of a pulse marked as '0,0' of the external clock signal (CLK) in FIG. 4. Since 'CL' is equal to six, data are outputted in synchronization with a rising edge of a sixth pulse of the external clock signal CLK (the rising edge of a pulse marked as '6.0' of the external clock signal) after the read command is applied.

As described above, the internal clock signal RCKDLL outputted from the DLL circuit has a negative delay with respect to the external clock signal CLK. FIG. 4 illustrates a negative delay in which the internal clock signal RCKDLL leads about one clock pulse over the external clock signal CLK.

As noted from FIG. 4, the pulse signal ROUTEN is enabled during a time in which the number of clocks of the internal clock signal RCKDLL corresponding to a burst length in the memory device is counted. That is, since the burst length is eight, it is preferred that a duration for which the pulse signal ROUTEN is enabled includes a time for which four clock pulses are toggled.

The output signal ROUTEN2 of the latch part 218 delays the pulse signal ROUTEN by a predetermined time. The sixth pulse to the ninth pulse of the internal clock signal RCKDLL occur while the output signal ROUTNE2 is being enabled to a high level. Preferably, a rising edge of the output signal ROUTEN 2 is created in synchronization with a falling edge of the fifth pulse of the internal clock signal RCKDLL, and a falling edge of the output signal ROUTEN2 is created in synchronization with a falling edge of the ninth pulse of the internal clock signal RCKDLL.

The rising edge of a pulse corresponding to an enable duration of the signal ROUTEN2_D1 outputted from the AND gate part 213 and 214 is created in synchronization with a rising edge of the sixth pulse of the internal clock signal RCKDLL, and the falling edge of the signal ROUTEN2_D1 is created in synchronization with the falling edge of the ninth pulse of the internal clock signal RCKDLL.

Accordingly, a time point in which the first pulse of the signal RCK_DO generated from the AND gate part 216 and 217 is generated is later than a time point in which the first pulse of the signal RCK_DO_QS generated from the AND gate part 211 and 212 is generated. Therefore, a data output time point is later than the conventional data output time point even though a timing in which the data strobe signal is generated is identical to that of the conventional data strobe signal. Herein, the difference between the two different timing corresponds to the 't1' of the conventional technique. Since a state of the output of the data buffer is changed into a low impedance state due to a signal delayed by a time of 't1', a data eye of the first output data may have the same width as data eyes of remaining seven data outputted subsequently to the first output data.

As described above, according to the present invention, a data output controller has been shown, which distinguishes a control signal controlling a timing in which a data strobe signal is outputted from a control signal controlling a time point in which data are outputted.

An additional control signal for controlling the data buffer is generated in such a manner that a time point can be adjusted in which the state of the output port of the data buffer is changed from a high impedance state to a low impedance state capable of sending data.

As described above, when the data output controller according to the present invention is employed, data eyes of data sequentially outputted have the same width. Also, the 'tLZ' specification required in the DDR, the DDR2 SDRAM, etc. is easily satisfied.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A data output controller for a memory device, comprising:
   a first switching part turned on/off by an internal clock signal outputted from a DLL means and receiving a first pulse signal enabled during a predetermined time in synchronization with the internal clock signal;
   a latch part for latching the first pulse signal passing through the first switching part;
   a second switching part turned on/off by the internal clock signal and receiving a latch part output signal outputted from the latch part;
   a first decoding part for receiving the latch part output signal and a second switching part output signal outputted from the second switching part and performing an 'AND' operation of the received latch part output signal and the received second switching part output signal;
   a second decoding part for receiving a first decoding part output signal and the internal clock signal and performing an 'AND' operation of the received first decoding part output signal and the internal clock signal;
   a third decoding part for receiving the latch part output signal and the internal clock signal and performing an 'AND' operation of the received latch part output signal and the internal clock signal;
   a data output buffer unit controlled by the second decoding part output signal; and
   a data strobe signal buffer unit controlled by a third decoding part output signal.

2. The data output controller as claimed in claim 1, wherein the first pulse signal is enabled during a time in which the number of clocks of the internal clock signal, corresponding to a burst length of the memory device, is counted.

3. The data output controller as claimed in claim 1, wherein windows of data sequentially outputted from the data output buffer unit have the same width.

4. The data output controller as claimed in claim 1, wherein the first pulse signal is enabled during a time in which the number of clocks of the internal clock signal, corresponding to a burst length of the memory device, is counted, and the latch part output signal is obtained by delaying the first pulse signal by a predetermined time and is enabled during a toggling duration of the internal clock signal corresponding to CAS latency of the memory device.

5. The data output controller as claimed in claim 4, wherein a first rising edge occurring time point of the second decoding part output signal is later than a first rising edge occurring time point of the third decoding part output signal.

6. The data output controller as claimed in claim 5, wherein a data strobe signal is outputted from the data strobe signal buffer unit in synchronization with a rising edge and a falling edge of the third decoding part output signal.

7. The data output controller as claimed in claim 5, wherein data are outputted from the data output buffer unit in synchronization with a rising edge and a falling edge of the second decoding part output signal.

8. A data output controller for a memory device, the data output controller comprising:
   a control part for generating a first pulse control signal and a second pulse control signal through a combination of an internal clock signal outputted from a DLL means and a pulse signal enabled during a time in which a number of clocks of the internal clock signal, corresponding to a burst length of the memory device, is counted;
   a data output buffer unit controlled by the first pulse control signal; and
   a data strobe signal buffer unit controlled by the second pulse control signal wherein the first pulse control signal and the second pulse control signal are not the same.

9. The data output controller as claimed in claim 8, wherein the first pulse control signal and the second pulse control signal are valid during the burst length, a first pulse rising edge occurring time point of the first pulse control signal is faster than a first pulse rising edge occurring time point of the second pulse control signal, and falling edges and rising edges of the first pulse control signal coincide with those of the second pulse control signal except for rising edges of first pulses of the first pulse control signal and the second pulse control signal.

* * * * *